United States Patent
Sunouchi

(12) 
(10) Patent No.: US 6,300,178 B1
(45) Date of Patent: *Oct. 9, 2001

(54) SEMICONDUCTOR DEVICE WITH SELF-ALIGNED CONTACT AND MANUFACTURING METHOD THEREOF

(75) Inventor: Kazumasa Sunouchi, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/179,318

(22) Filed: Oct. 27, 1998

(30) Foreign Application Priority Data

Oct. 28, 1997 (JP) .................................................. 9-295420

(51) Int. Cl.⁷ .............................. H01L 27/01; H01L 27/12
(52) U.S. Cl. .................. 438/199; 438/233; 438/586; 438/587; 438/618; 257/350; 257/382
(58) Field of Search ..................................... 438/199, 233, 438/586, 618, 587, 275, 188, 533, 621, 637, 258, 241, 279, 229, 195, 197; 257/365, 350, 382, 274

(56) References Cited

U.S. PATENT DOCUMENTS

| | | | | |
|---|---|---|---|---|
| 5,294,822 | * | 3/1994 | Verrett | 257/368 |
| 5,610,092 | * | 3/1997 | Tasaka | 438/275 |
| 5,718,800 | * | 2/1998 | Juengling | 438/233 |
| 5,899,742 | * | 5/1999 | Sun | 438/682 |
| 5,930,616 | * | 7/1999 | Dennison | 438/232 |
| 5,985,711 | * | 11/1999 | Lim | 438/233 |

* cited by examiner

Primary Examiner—Olik Chaudhuri
Assistant Examiner—Phat X. Cao
(74) Attorney, Agent, or Firm—Pillsbury Winthrop LLP

(57) ABSTRACT

The present invention simplifies a manufacturing process by performing contact hole formation in a single step even in manufacturing a device having a self alignment contact. A cap layer having a contact portion is formed in a self alignment manner on a gate electrode formed on a silicon substrate. After a SiO₂ interlayer film is deposited on the cap layer and the silicon substrate, the patterning of a contact hole is performed. Thereafter, a wiring layer is formed in the contact hole. The diameter of the contact portion is formed differently from the diameter of the contact hole.

30 Claims, 7 Drawing Sheets

SEMICONDUCTOR DEVICE WITH SELF-ALIGNED CONTACT AND MANUFACTURING METHOD THEREOF

BACKGROUND OF THE INVENTION

The present invention relates to high integration of a semiconductor device, and more particularly, to a semiconductor device manufactured in a simplified process including a self-aligned contact process and a method of manufacturing the semiconductor device.

Recently, there has been a remarkable progress in integration technology of a semiconductor integrated circuit. The high integration of a semiconductor integrated circuit is generally attained if a micro line, space, and contact pattern are realized by improving a lithographic resolution.

However, alignment technique between layers has been less improved in comparison with resolution technique in lithography. In these circumstances, if alignment allowance is ensured, an entire area size inevitably increases. This is a big problem preventing high integration of the circuit.

In an attempt to overcome the increase in area size, a method has been employed in which a contact is formed in a self-alignment manner to the gate.

For example, manufacturing steps of a semiconductor device conventionally formed by such a method are shown in FIGS. 1A to 1F.

In FIG. 1A, a device isolating region 4 is formed in the surface portion of a silicon substrate 2 and a well 2a, which has an opposite conductive type to that of the substrate 2. An n-diffusion layer 6 is formed in the surface portion of the silicon substrate 2. A p-diffusion layer 8 is formed in a surface portion of the well 2a. A gate electrode 12 is formed on the silicon substrate 2 and well 2a via a gate oxide film 10. A reference numeral 14 indicates a cap layer formed of a silicon nitride (SiN) film. Furthermore, a silicon nitride film 16 is formed on the silicon substrate 2. Note that a gate side wall 18 is formed on both sides of the gate electrode 12.

As shown in FIG. 1B, the silicon nitride film 16 is removed from the surface of the silicon substrate in each of the regions with and without the well 2a by RIE (reactive ion etching), and thereafter, impurity ions are implanted into the silicon substrate 2 and the well 2a. In this manner, N$^+$ diffusion layers 20, 22 and a P$^+$ diffusion layer 24 serving as a source/drain are formed. Thereafter, an interlayer film 26 is deposited over an entire surface of the silicon substrate 2.

Subsequently, as shown in FIG. 1C, a resist 28 is formed on the interlayer film 26. However, the resist 28 is not formed on a contact formation region to the source/drain of the substrate 2. Then, etching is selectively performed to the resultant structure under such a condition that the silicon nitride film 14 is not etched, as shown in FIG. 1D, using the resist 28 as a mask. As a result, a contact hole 30 is formed. Accordingly, a contact (to the gate electrode) can be formed even if an alignment allowance is not taken to the gate.

As shown in FIG. 1E, a resist 32 is deposited in the contact hole 30 and on the interlayer film 26 excluding the portion in which a contact (to the gate) is to be formed in a later step. Thereafter, a contact hole 34 is formed on the gate using the resist 32 as a mask.

Thereafter, as shown in FIG. 1F, metal wiring layers 36, 38 are formed in each of contact holes 30, 34 and on the interlayer film 26.

However, the semiconductor formation method mentioned above requires two contact hole formation steps opposite to each other, that is, the step of forming a contact hole by etching the nitride film formed on the gate (corresponding to FIG. 1E) and a step of forming a contact hole without etching the nitride film formed on the gate (corresponding to FIG. 1D). Since two steps are required for the contact hole formation, the number of processing steps increases.

BRIEF SUMMARY OF THE INVENTION

An object of the present invention is to provide a semiconductor device and a manufacturing method thereof capable of forming a semiconductor device, which requires a single contact hole formation step, even if a self aligned contact is included in the device.

More specifically, the semiconductor device of the present invention comprises a gate electrode formed above a semiconductor substrate;

a cap layer having a first contact hole, formed on the gate electrode in a self alignment manner to the gate electrode;

an interlayer film deposited above the semiconductor substrate and the cap layer, and having a second contact hole formed on the first contact hole; and a wiring layer formed in the first and second contact holes, wherein the first contact hole and second contact hole are formed by using mutually different masks.

The method of manufacturing a semiconductor device according to the present invention comprises a first step of processing a laminate structure having a gate insulating film, a gate electrode and a cap layer formed on a substrate, into a gate form in order to form a first conductive-type MIS transistor and a second conductive type MIS transistor;

a second step of etching an entire surface of an insulating film which coats the first conductive type MIS transistor region and a cap layer formed on gate contact portions of the first and second conductive type MIS transistors to substantially expose a substrate surface of the first conductive type MIS transistor and at the same time, to remove a part of the cap layer from the gate contact portions of the first and second conductive type MIS transistors and then, implanting a first conductive type impurity; and a third step of etching an entire surface of an insulating film which coats the second conductive type MIS transistor region and a cap layer formed on the gate contact portions of the first and second conductive type MIS transistors to substantially expose a substrate surface of the second conductive type MIS transistor and at the same time, to remove remainders of the cap layer on the gate contact portion of the first conductive type MIS transistor and the cap layer on the gate contact portion of the second conductive type MIS transistor, and then, implanting a second conductive type impurity.

Furthermore, the method of manufacturing a semiconductor device according to the present invention comprises a first step of processing a laminate structure having a gate insulating film, a gate electrode, and a cap layer formed on a substrate into a gate form, in order to form a first conductive type MIS transistor and a second conductive type MIS transistor;

a second step of implanting a first conductive type impurity and a second conductive type impurity into the first conductive type MIS transistor region and the second conductive type MIS transistor region, respectively;

a third step of depositing an insulating layer over an entire surface of the first conductive type MIS transistor region and the second conductive type MIS transistor region;

a fourth step of removing the insulating layer between adjacent gates in a part of an MIS transistor formation region to thereby substantially expose a substrate surface;

a fifth step of selectively forming a plug contact between the adjacent gates;

a sixth step of etching an entire surface of an insulating film which coats the first conductive type MIS transistor region and the cap layer formed on gate contact portions of the first and second conductive type MIS transistors to substantially expose a substrate surface of the first conductive type MIS transistor and at the same time, to remove a part of the cap layer on the gate contact portions of the first and second conductive type MIS transistors, and then, implanting a first conductive type impurity;

a seventh step of etching an entire surface of an insulating film which coats the second conductive type MIS transistor region and the cap layer formed on the gate contact portions of the first and second conductive MIS transistors to substantially expose a substrate surface of the second conductive type MIS transistor and at the same time, to remove remainders of the cap layer on the gate contact portion of the first conductive type MIS transistor and the cap layer on the gate contact portion of the second conductive type MIS transistor, and then, implanting a second conductive type impurity;

an eighth step of forming an interlayer film, which is different from the insulating film, above the substrate; and a ninth step of forming a contact hole by selectively etching the interlayer film, the contact hole extending to a source/drain of the first conductive type MIS transistor, a source/drain of the second conductive type MIS transistor and the gate contact portions.

In the present invention, when resist masks for the N-type impurity implantation and P-type impurity implantation are formed, a pattern is formed so as to remove the contact portion above the gate. By virtue of this, an integrated circuit having a self-aligned contact can be formed by a single contact hole formation step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings.

First, Embodiment 1 of the present invention will be explained referring to FIGS. 2 and 3. In the semiconductor device according to Embodiment 1, a memory cell region of DRAM and a peripheral circuit region having an N-MOSFET and a p-MOSFET are formed on a single semiconductor substrate.

Figure 1A:
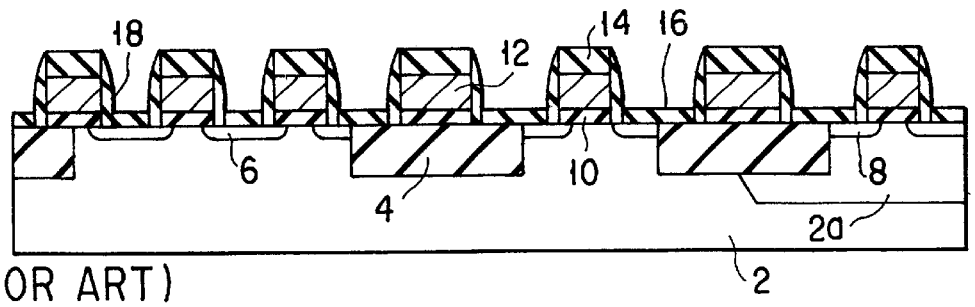
FIGS. 1A to 1F are cross-sectional views of a conventional semiconductor device, showing manufacturing steps.
Figure 1B:
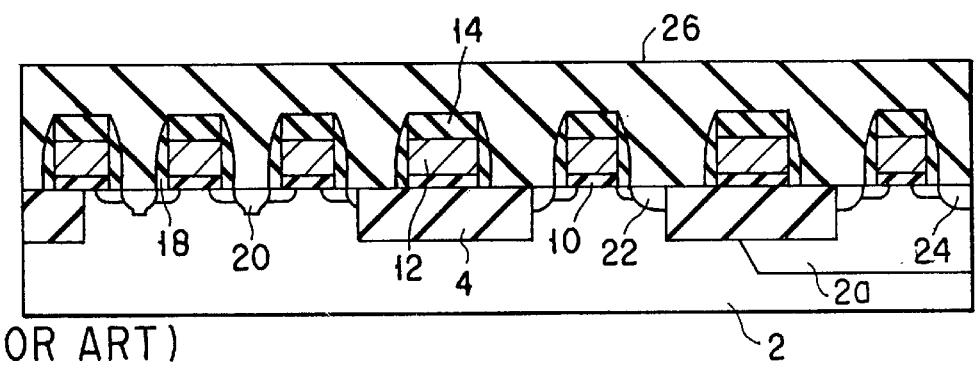
Figure 1C:
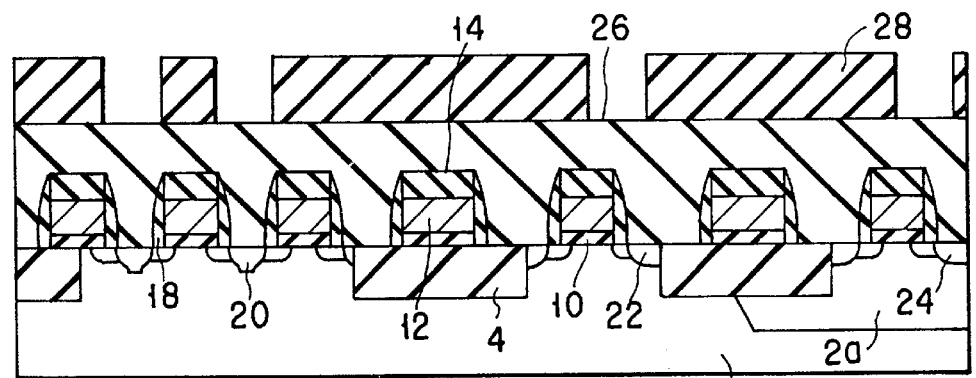
Figure 1D:
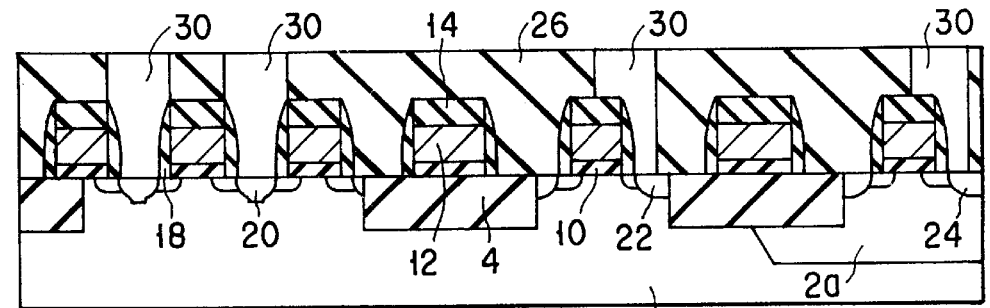
Figure 1E:
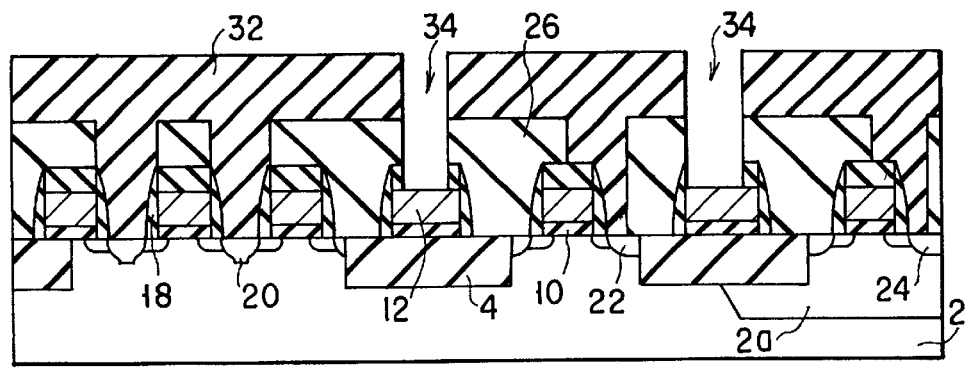
Figure 1F:
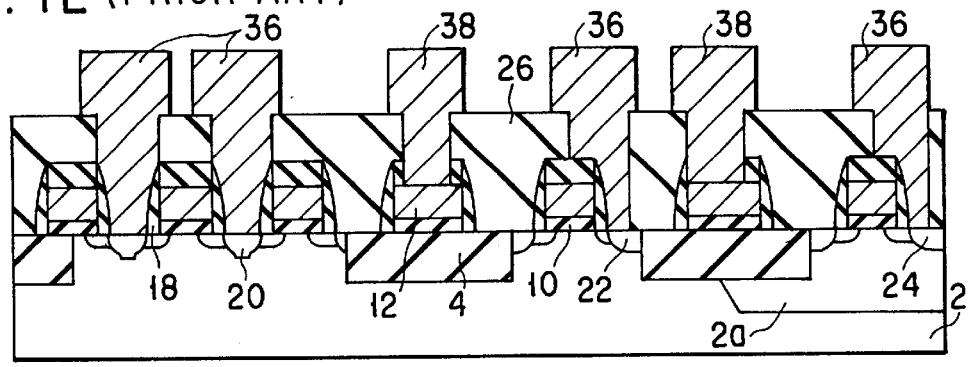
Figure 2A:
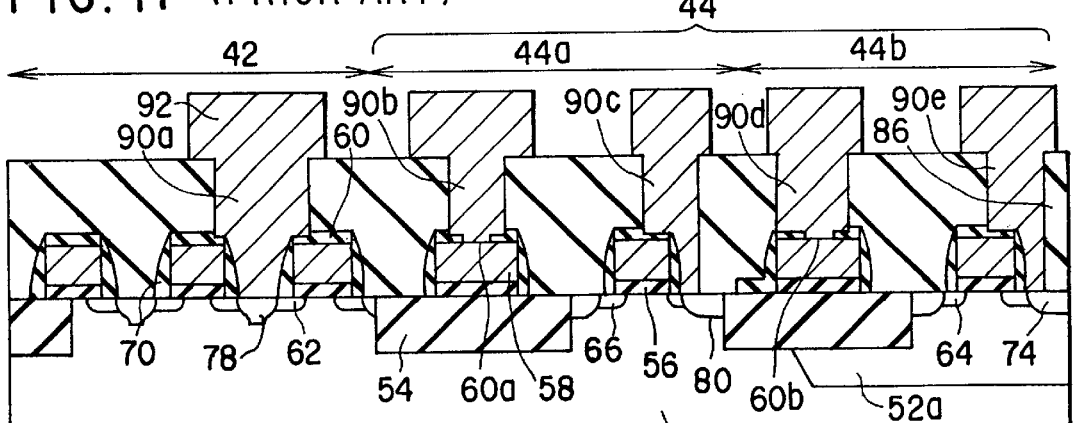
FIG. 2A is a cross-sectional view of a semiconductor device according to Embodiment 1 of the present invention, in which the diameter of a contact hole portion in the interlayer film is larger than that of the contact hole portion in contact with the gate.
Figure 2B:
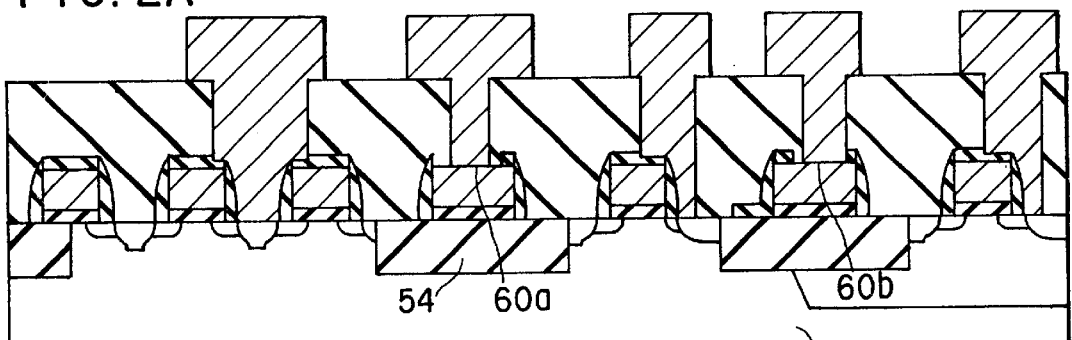
FIG. 2B is a cross-sectional view of a semiconductor device according to Embodiment 1 of the present invention, in which the diameter of a contact hole portion in the interlayer film is smaller than that of the contact hole portion in contact with the gate.

FIGS. 2A and 2B are cross-sectional views of the semiconductor device according to Embodiment 1 of the present invention. In these cases, the diameter (first diameter) of the contact hole portion in contact with the gate differs from the diameter (second diameter) of the contact hole portion in a $SiO_2$ interlayer film. More specifically, the second diameter is larger than the first diameter in the case of FIG. 2A. Conversely, the second diameter is smaller than the first diameter in the case of FIG. 2B.

FIGS. 3A to 3F are cross sectional views of the semiconductor device according to Embodiment 1, showing manufacturing process thereof.

Figure 3A:
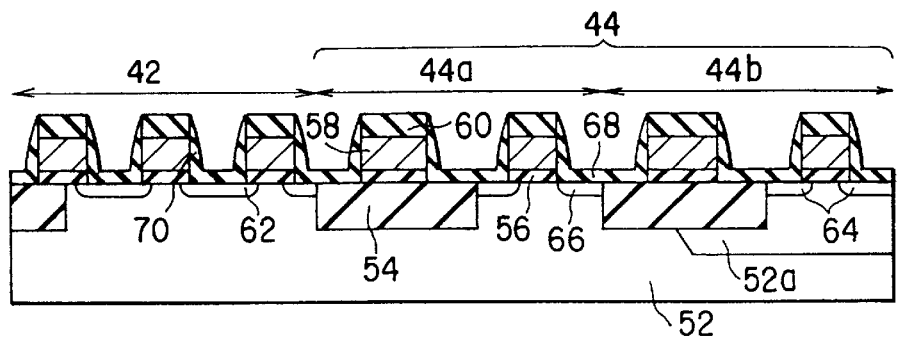
FIGS. 3A to 3F are cross-sectional views of a semiconductor device according to Embodiment 1 of the present invention, showing manufacturing steps.

In FIG. 3A, an n-well 52a is formed on a p-type silicon (Si) substrate 52 in a lithographic step. Thereafter, a device isolating region 54 is formed in the surface of the p-type silicon substrate 52 and between an n-channel MOS transistor of the memory cell region 42 and an N-channel MOS transistor 44a of the peripheral circuit region 44, and between an N-channel MOS transistor 44a and a p-channel MOS transistor 44b of the peripheral circuit region 44.

Subsequently, a gate insulating film 56, a polysilicon layer (gate electrode) 58, and a silicon nitride film (cap layer) 60 are stacked one upon the other on the surface portion of the silicon substrate 52. The resultant structure is subjected to ion implantation and thermal treatment, thereby forming n, p, and n type source/drain diffusion regions (shallow diffusion layers) 62, 64, 66 in the surface of the silicon substrate 52. Furthermore, a silicon nitride film 68 is deposited in such a way that the space between the gates may not be filled with the silicon nitride film 68. Note that a gate side wall 70 is formed on both sides of the gate electrode 58.

Figure 3B:
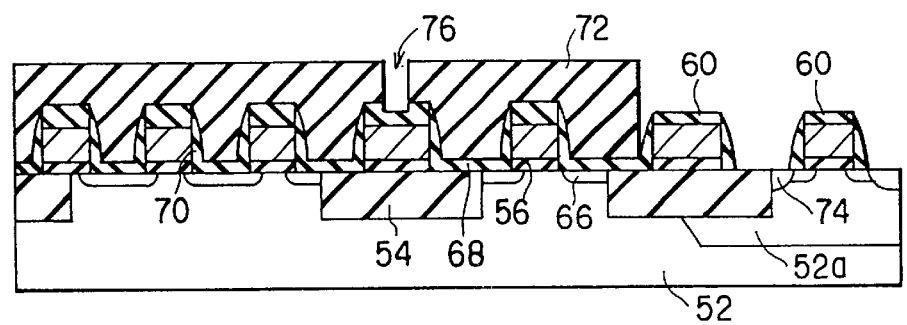

As shown in FIG. 3B, using a resist 72 as a mask, the silicon nitride film 68 is selectively etched off from the P-channel MOS transistor 44b of the peripheral circuit region 44 by reactive ion etching (RIE). Thereafter, a P+ layer 74 serving as a source/drain is formed by ion implantation.

Note that the resist 72 is formed so as to have a contact pattern 76 for etching away a silicon nitride film 60 not only from the P-channel MOS transistor 44b but also from a part of the gate of the N-channel MOS transistor 44a in the peripheral circuit region 44. The contact pattern 76 is formed so that the underlying silicon nitride film 60 may be etched away.

On the other hand, the silicon nitride film 60 formed on the gate of the P-channel MOS transistor 44b is completely exposed. Since no contact pattern is formed, the entire surface of the silicon nitride film 60 is uniformly etched away.

Figure 3C:
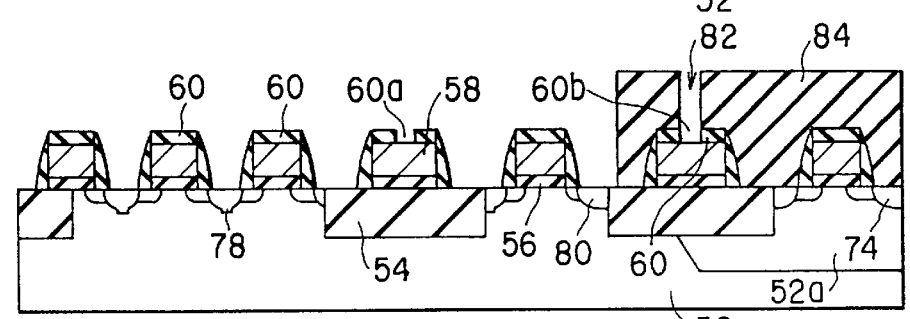

In FIG. 3C, the silicon nitride film 68 formed on the memory cell region 42 and the N-channel MOS transistor 44a of the peripheral circuit region 44 is etched away by RIE using a resist 84 as a mask. Thereafter, n-type impurity ions are implanted into the substrate surface to form N+ layers 78 and 80 serving as a source/drain.

In this case, a contact pattern 82 is formed on the gate of the P-channel MOS transistor 44b. The contact pattern 82 is formed in such a way that the underlying silicon nitride film 60 may be etched away by using the resist 84 as a mask. On the other hand, the silicon nitride film 60 is uniformly etched off from the gate of the N-channel MOS transistor 44a.

In the N-channel MOS transistor 44a and the P-channel MOS transistor 44b of the peripheral circuit region 44, contact holes are formed by etching the contact portions 60a and 60b on the gate twice in the aforementioned steps. As a result, the gate polysilicon layer 58 is exposed therein. Note that the silicon substrate 52 is also exposed by etching the silicon nitride film 68.

Next, the P+ layer 74 and the N+ layers 78, 80 (serving as a source/drain) formed on the afore-mentioned step are activated by applying heat treatment to them.

Figure 3D:
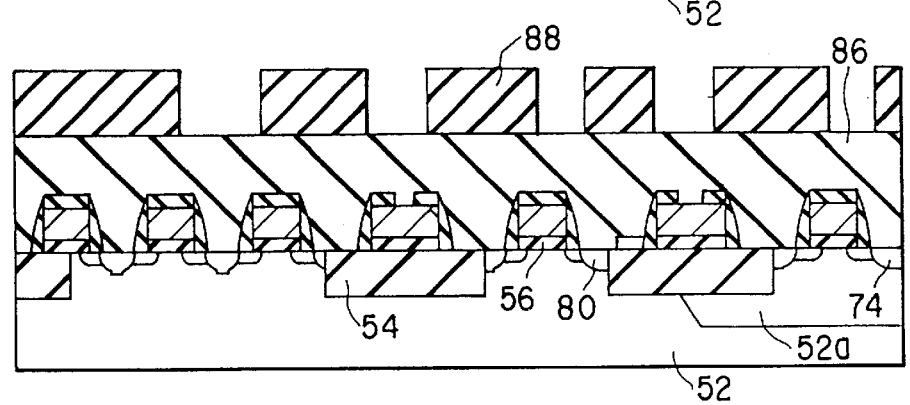
Figure 3E:
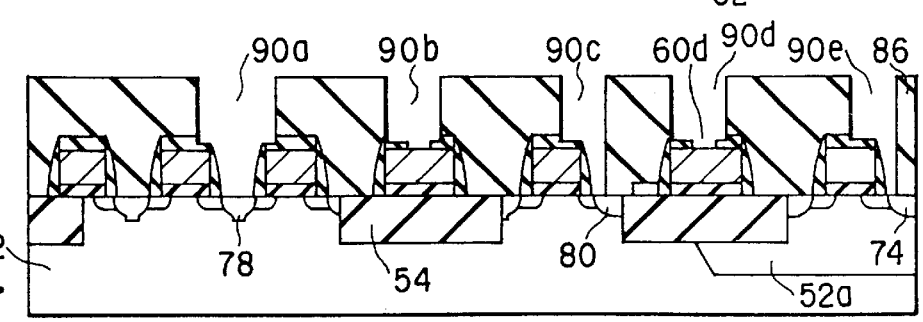

Then, as shown in FIG. 3D, after a $SiO_2$ interlayer film 86, which has an etching selective ratio between the silicon nitride film (cap layer) 60 and the gate side wall 70, is deposited, a resist 88 is formed on the film 86 except a contact-hole formation portion. Thereafter, as shown in FIG. 3E, contact holes 90a, 90b, 90c, 90d, 90e are patterned by selectively etching the interlayer film 86.

In this case, the contact holes 90a, 90c, 90e on the P+ layer 74 and the N+ layers 78, 80 (serving as a source/drain) are formed in a self-alignment manner to the gates. Whereas, in the contact holes 90b, 90d formed on the gates, the silicon nitride film 60 is not present. As a result, contact portions 60a, 60b in contact with the gate polysilicon layer 58 are formed.

Figure 3F:
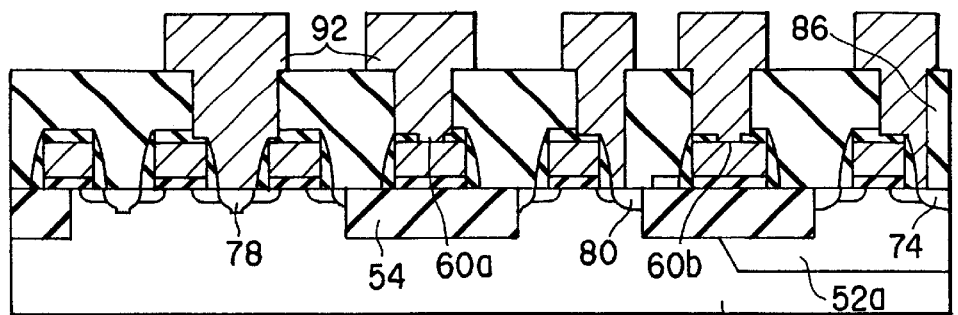

As shown in FIG. 3F, a wiring layer 92 is formed in the formed contact holes 90a to 90e and on the interlayer film 86.

As described, according to the method of Embodiment 1, it is possible to form an integrated circuit including a self-aligned contact (SAC) structure without increasing the number of lithographic steps.

Now, Embodiment 2 of the present invention will be explained.

FIGS. 4A to 4L are cross-sectional views of a semiconductor device according to Embodiment 2, showing manufacturing steps thereof. Embodiment 2 is the same as Embodiment 1 except that a plug is formed on a micro patterning portion in advance. Like reference numerals are used in FIGS. 4A to 4L to designate like structural elements corresponding to those in FIGS. 3A to 3F and any further explanation is omitted.

Figure 4A:
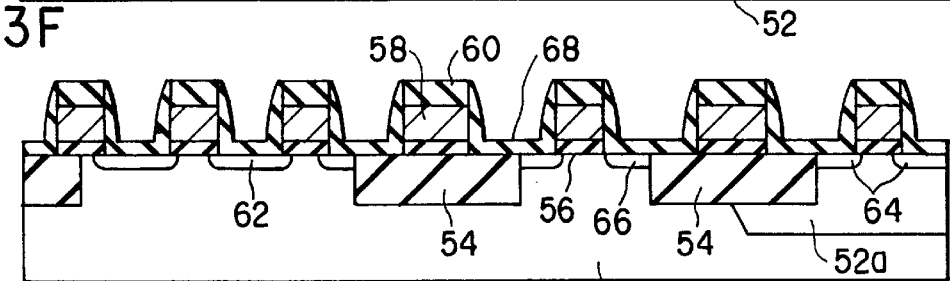
FIGS. 4A to 4L are cross-sectional views of a semiconductor device according to Embodiment 2 of the present invention, showing manufacturing steps which is the same as in Embodiment 1 except that a plug is previously formed in a micro-patterned portion.

In FIG. 4A, a device isolating region 54 is formed in a surface of a substrate 52. Subsequently, a gate insulating film 56, a polysilicon layer 58, and a silicon nitride film 60 are stacked one upon the other on the silicon substrate 52. Then, ion implantation and heat treatment are applied to the resultant structure, to form source/drain diffusion regions 62, 64, 66 on the surface of the silicon substrate 52. A silicon nitride film 68 is formed on the source/drain diffusion regions 62, 64, 66 in such a way that a space between gates may not be filled with the film 68.

Figure 4B:
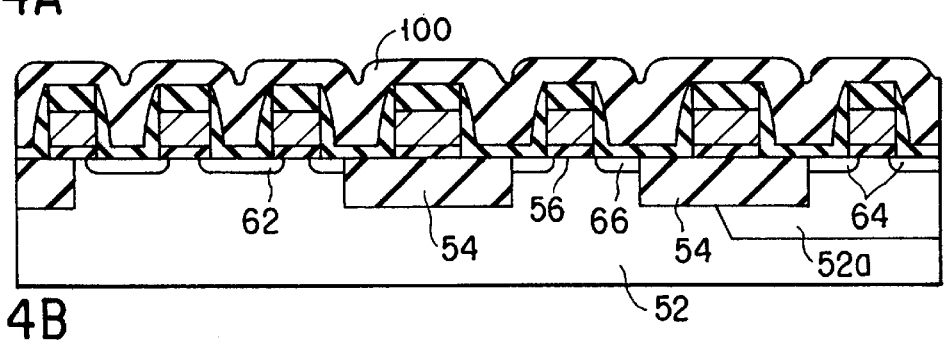
Figure 4C:
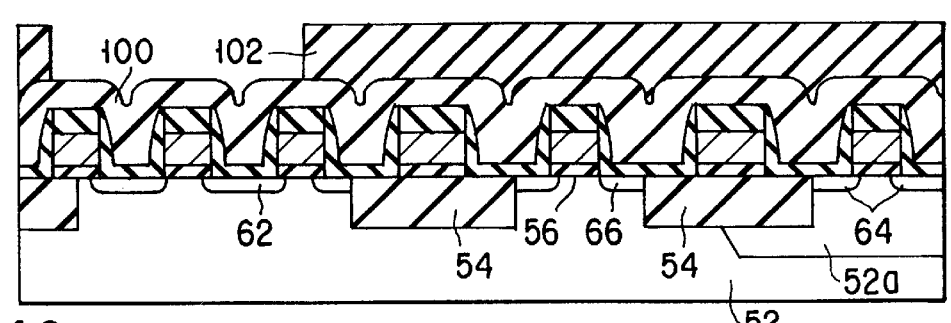

As shown in FIG. 4B, for example, a $SiO_2$ insulating layer 100 is deposited over the entire surface so as to fill the space between the gates. Then, lithography is applied to the resultant structure in such a way that a portion except the memory cell region may be covered with a resist mask 102, as shown in FIG. 4C.

Figure 4D:
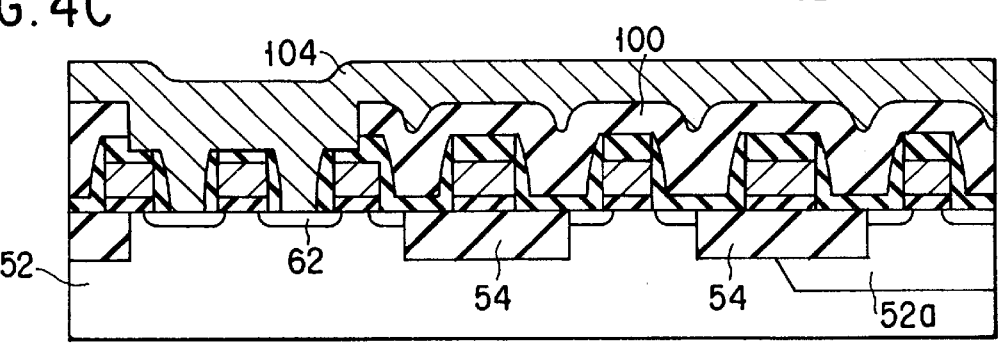

Subsequently, the exposed insulating layer 100 and silicon nitride film 68 in the gate portion of the memory cell region are subsequently etched away. Furthermore, the resist mask 102 is removed and then an N-type polysilicon 104 is deposited over the entire surface doped with impurities, as shown in FIG. 4D.

Figure 4E:
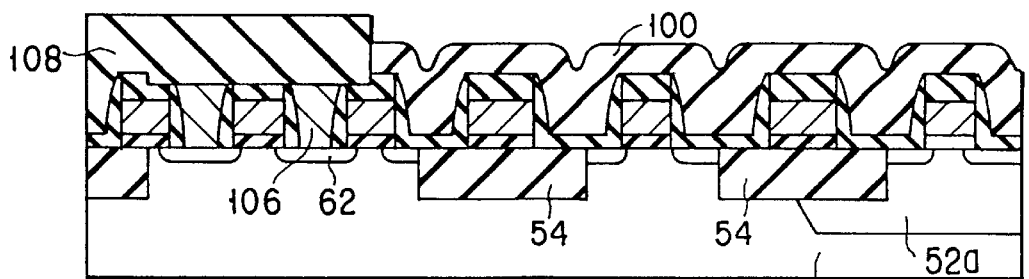

The N-type polysilicon 104 is etched back. In this manner, the N-type polysilicon 104 is selectively left in the space between the gates of the memory cell region, as shown in FIG. 4E. As a result, a plug 106 is formed. Thereafter, the memory cell region including the space between gates is covered with the resist mask 108 and then the insulating layer 100 of the peripheral circuit region is removed.

Figure 4F:
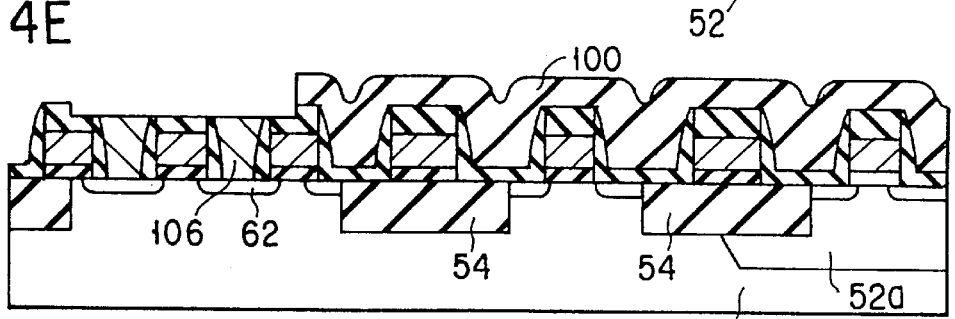

Thereafter, as shown in FIG. 4F, the resist mask is removed. Subsequently, a silicon nitride film is formed over the entire surface of the semiconductor device. In this way, the semiconductor device having a plug in a part of the space between side walls of the adjacent gates.

Figure 4G:
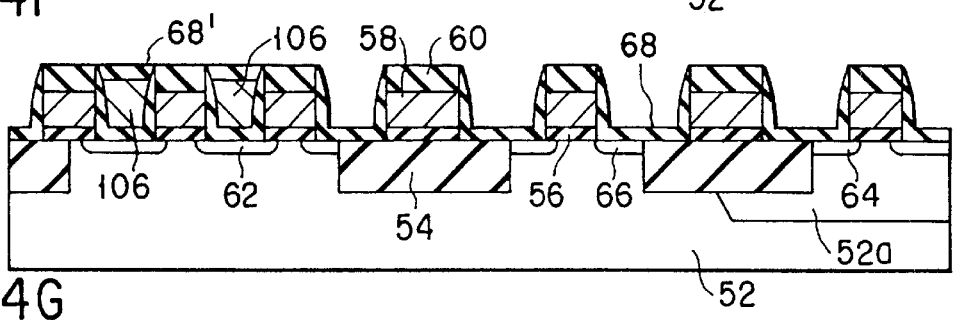

In the semiconductor device manufactured in the steps of FIGS. 4A to 4F, the plug 106 is formed in the space between the side walls of adjacent gates in the micro-patterned memory cell region, as shown in FIG. 4G. The silicon nitride film 68' is formed on the plug 106.

Figure 4H:
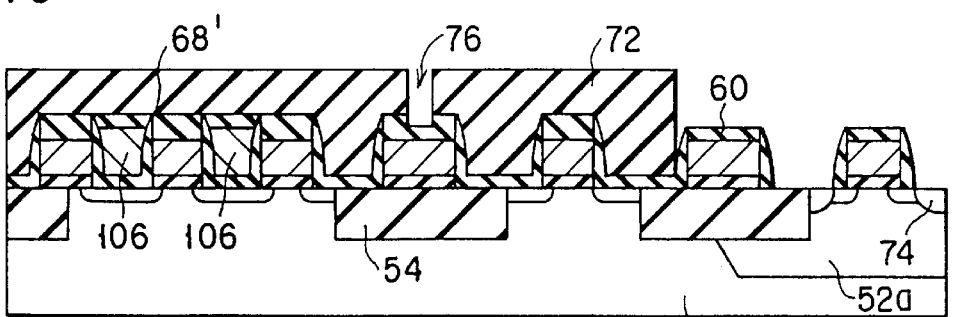

As shown in FIG. 4H, after the silicon nitride film 68 is removed by RIE from the p-channel MOS transistor in the peripheral circuit region, a P+ layer 74 serving as a source/drain is formed by ion implantation. In this case, the resist 72 having a contact pattern 76 is formed on the gate of the N-channel MOS transistor in the peripheral circuit region. Thereafter, the underlying silicon nitride film 60 at the contact pattern 76 is etched away. Whereas, the silicon nitride film 60 on the gate of the P-channel MOS transistor is completely exposed and therefore no contact pattern is formed. Hence the silicon nitride film 60 is uniformly etched away.

Figure 4I:
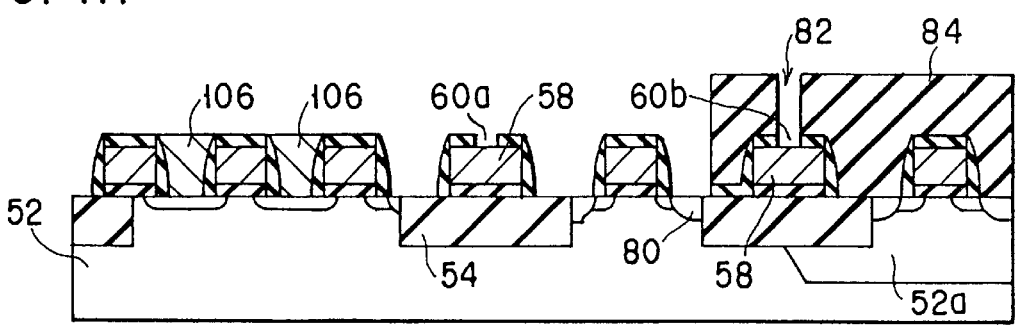

Then, as shown in FIG. 4I, the silicon nitride films 68, 68' on N-channel MOS transistors of the memory cell region and the peripheral circuit region are etched off by RIE using a resist 84 as a mask. Subsequently, n-type impurity ions are implanted to form an N+ layer 80.

In this case, a contact pattern 82 is formed on the gate of the P-channel MOS transistor so that the underlying silicon nitride film 60 at the contact pattern 82 can be etched away. The silicon nitride film 60 on the gate of N-channel MOS transistors in the memory cell region and the peripheral circuit region is uniformly etched away.

By the steps mentioned above, the contact portions 60a, 60b formed on the gates of the N-channel MOS transistor and the P-channel MOS transistor are etched twice. As a result, a contact hole is formed in which the gate polysilicon layer 58 is exposed. At the same time, the silicon substrate 52 is also exposed by etching the silicon nitride film 68 during the etching step. In addition, the plug 106 is exposed in the memory cell region by etching the silicon nitride film 68'.

The P⁺ layer 74 and the N⁺ layer 80 (serving as a source/drain) formed in the steps mentioned above are activated by applying a heat treatment to them.

Figure 4J:
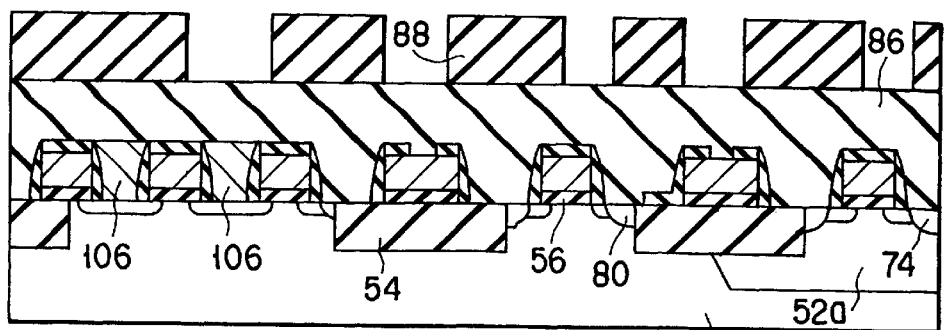
Figure 4K:
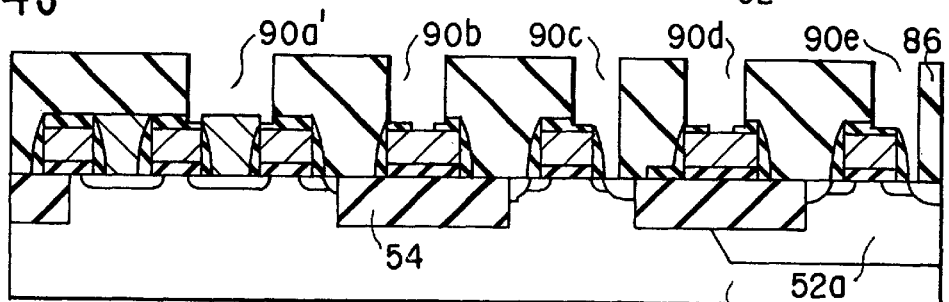

After a SiO₂ interlayer film 86 is deposited, the resist 88 is formed in a portion except a contact hole formation portion, as shown in FIG. 4J. Subsequently, contact holes 90a', 90b, 90b, 90d, 90e are patterned, as shown in FIG. 4K, by selectively etching the interlayer film 86.

In this case, the contact holes 90a', 90c, 90e formed respectively on the plug 106, the P⁺ layer 74 and the N⁺ layer 80 are formed in a self-alignment manner to the gates. Whereas, in the contact holes 90b, 90d formed on the gates, a contact with the gate polysilicon layer 58 can be obtained through the contact regions 60a, 60b in which no silicon nitride film 60 is present.

Figure 4L:
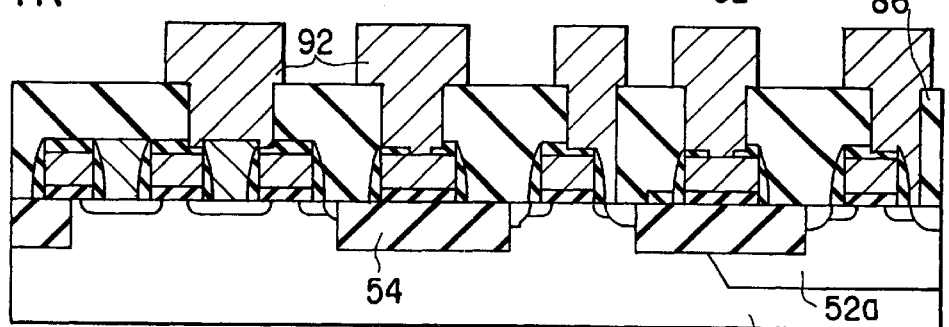

As shown in FIG. 4L, a wiring layer 92 is formed in the formed contact holes 90a' and 90b to 90e and on the interlayer film 86.

In this way, a plug contact may be formed before a deep diffusion layer having an LDD structure is formed by implantation in a portion having a micro patterned pitch between adjacent gates.

Now, Embodiment 3 will be explained.

FIGS. 5A to 5G are cross-sectional views of a semiconductor device, showing a manufacturing process which is the same as in Embodiment 1 except that a thin silicon nitride film is deposited before an entire contact hole is etched.

Figure 5A:
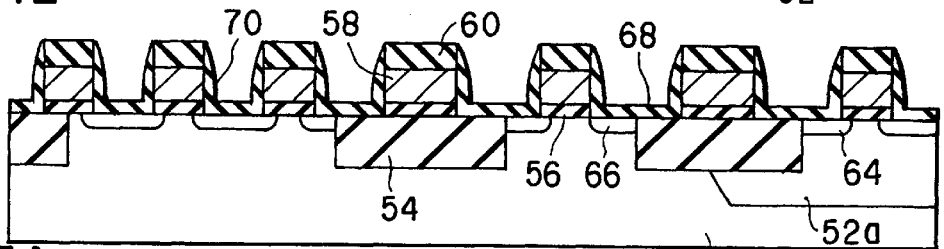
FIGS. 5A to 5G are cross-sectional views of a semiconductor device according to Embodiment 3 of the present invention, showing manufacturing steps which is the same as in Embodiment 1 except that a thin silicon nitride film is deposited before an entire contact hole is etched.
Figure 5B:
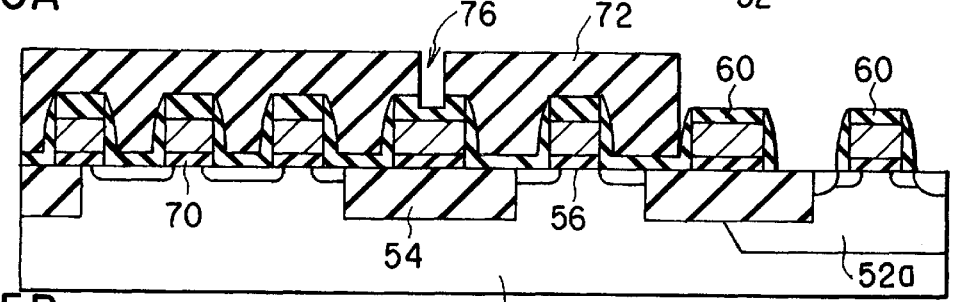
Figure 5C:
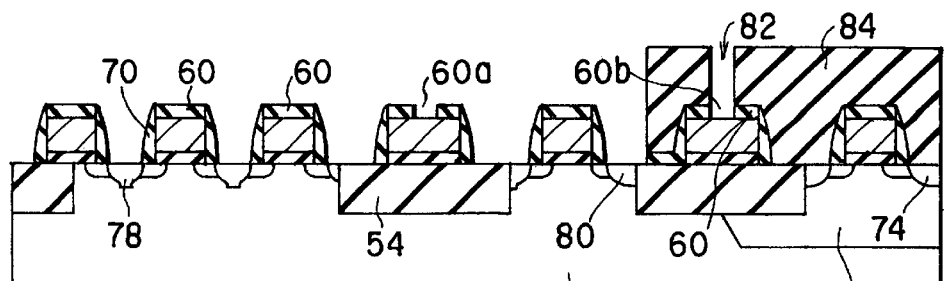

FIGS. 5A to 5C are the same as FIGS. 3A to 3C regarding Embodiment 1, detailed explanation is omitted.

Figure 5D:
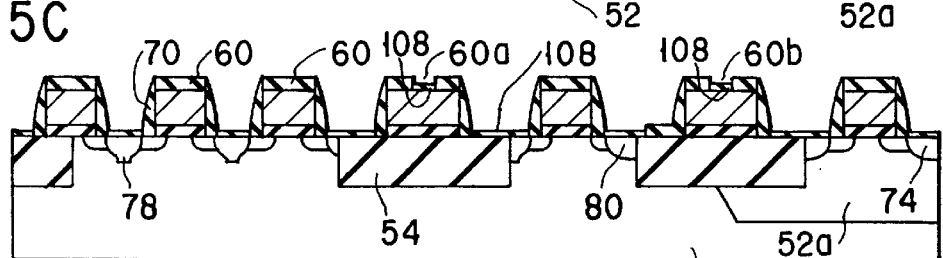

After the contact portions 60a, 60b are formed by the process of FIGS. 5A to 5C, a thin silicon nitride film 108 is formed on the surface of the substrate 52, as shown in FIG. 5D.

Figure 5E:
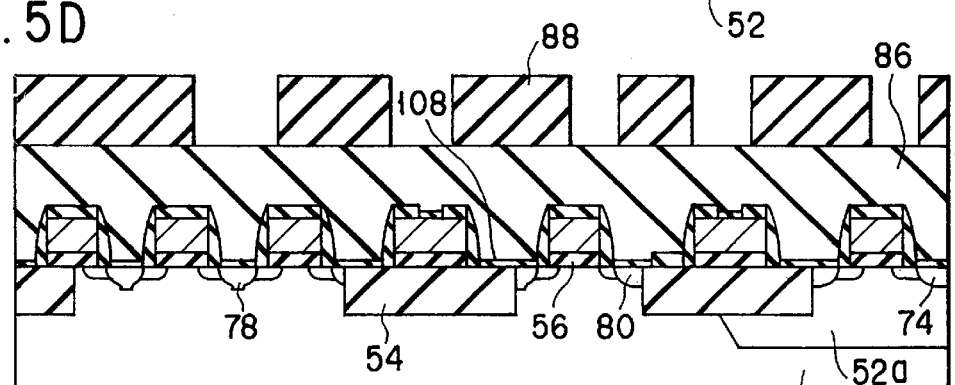
Figure 5F:
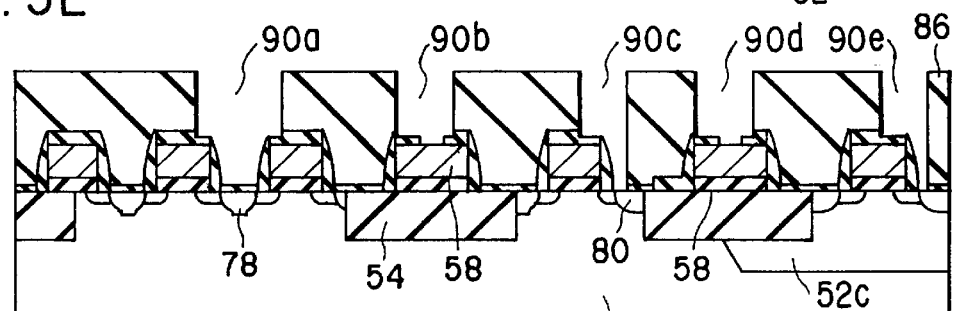

As shown in FIG. 5E, after a SiO₂ interlayer film 86 is deposited on the thin silicon nitride film 108 and the silicon nitride film 60, a resist 88 is formed on the portion excluding a contact hole formation portion. Then, as shown in FIG. 5F, the contact holes 90a to 90e are patterned and the interlayer film 86 is selectively etched by RIE. In this time, a thin silicon nitride film 108, which is deposited on the P⁺ layer 74, and N⁺ layers 78, 80 (serving as a source/drain) within the contact holes 90a to 90e and on the contact portions 60a, 60b to the gate, is also removed.

In this case, the contact holes 90a, 90c, 90e formed on the P⁺ layer 74 and the N⁺ layers 78, 80 (serving as a source/drain), are formed in a self-alignment manner to the gates. Whereas, in the contact holes 90b, 90d formed on the gates, contact to a gate polysilicon layer 58 is obtained through contact regions 60a, 60b in which no silicon nitride film 60 is present.

Figure 5G:
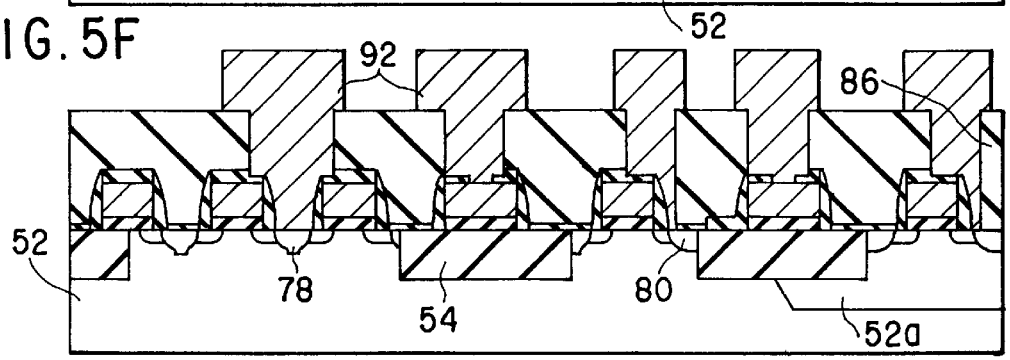

Subsequently, a wiring layer 92 is formed in the formed contact holes 90a to 90e and on the interlayer film 86, as shown in FIG. 5G.

According to the method of Embodiment 3, since the thin silicon nitride film and the STI portion serving as the element isolation region have etching selective ratios, respectively, it is possible to prevent an STI portion from being etched during the etching of the contact portion. As a result, the reliability of the process is improved when contact is formed in a self-alignment manner.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

a first step of processing a laminate structure having a gate insulating film, a gate electrode and a cap layer formed on a substrate, in order to form a first conductive-type MIS transistor and a second conductive type MIS transistor;

a second step of etching an entire surface of an insulating film which coats the first conductive type MIS transistor region and a cap layer formed on gate contact portions of the first and second conductive type MIS transistors to substantially expose a substrate surface of the first conductive type MIS transistor and at the same time to remove a part of the cap layer from the gate contact portions of the first and second conductive type MIS transistors and then, implanting a first conductive type impurity; and a third step of etching an entire surface of an insulating film which coats the second conductive type MIS transistor region and a cap layer formed on the gate contact portions of the first and second conductive type MIS transistors to substantially expose a substrate surface of the second conductive type MIS transistor and at the same time, to remove remainders of the cap layer on the gate contact portion of the first conductive type MIS transistor and the cap layer on the gate contact portion of the second conductive type MIS transistor, and then, implanting a second conductive type impurity.

2. The method of manufacturing a semiconductor device according to claim 1, further comprising, after the third step, a fourth step of forming an interlayer film which is different from the insulating film, above the substrate; and a fifth step of forming contact holes by selectively etching the interlayer film, said contact holes extending to a source/drain and the gate contact portion of each of the first conductive type MIS transistor and the second conductive type MIS transistor.

3. The method of manufacturing a semiconductor device according to claim 1, further comprising, between the first step and the second step, a step of forming a shallow diffusion layer having an LDD structure in at least one of the first conductive type MIS transistor and the second conductive type MIS transistor by implanting impurity into the substrate.

4. The method of manufacturing a semiconductor device according to claim 1, further comprising, between the first step and the second step, a step of forming a plug contact in a part of a space between adjacent gates.

5. The method of manufacturing a semiconductor device according to claim 4, wherein, in the step of forming a plug contact, a plug material is deposited between the adjacent gates, followed by etching-back, thereby burying the plug material between the adjacent gates.

6. The method of manufacturing a semiconductor device according to claim 5, wherein polysilicon is used as the plug material.

7. The method of manufacturing a semiconductor device according to claim 2, further comprising, between the third step and the fourth step, a step of depositing a thin insulating film on the substrate.

8. The method of manufacturing a semiconductor device according to claim 7, wherein the thin insulating film and an element isolation insulating film formed between the first conductive type MIS transistor and the second conductive type MIS transistor have respective etching selective ratios.

9. The method of manufacturing a semiconductor device according to claim 2, wherein the contact holes extending to the source/drain of the first conductive type MIS transistor and to the source/drain of the second conductive type MIS transistor are formed in a self-alignment manner as to the laminate structure processed into the gate form.

10. A method of manufacturing a semiconductor device comprising:
  a first step of processing a laminate structure having a gate insulating film, a gate electrode, and a cap layer formed on a substrate in order to form a first conductive type MIS transistor and a second conductive type MIS transistor;
  a second step of implanting a first conductive type impurity and a second conductive type impurity into the first conductive type MIS transistor region and the second conductive type MIS transistor region, respectively;
  a third step of depositing an insulating layer over an entire surface of the first conductive type MIS transistor region and the second conductive type MIS transistor region;
  a fourth step of removing the insulating layer between adjacent gates in a part of an MIS transistor formation region to thereby substantially expose a substrate surface;
  a fifth step of selectively forming a plug contact between the adjacent gates;
  a sixth step of etching an entire surface of an insulating film which coats the first conductive type MIS transistor region and the cap layer formed on gate contact portions of the first and second conductive type MIS transistors to substantially expose a substrate surface of the first conductive type MIS transistor and at the same time, to remove a part of the cap layer on the gate contact portions of the first and second conductive type MIS transistors, and then, implanting a first conductive type impurity;
  a seventh step of etching an entire surface of an insulating film which coats the second conductive type MIS transistor region and the cap layer formed on the gate contact portions of the first and second conductive MIS transistors to substantially expose a substrate surface of the second conductive type MIS transistor and at the same time, to remove remainders of the cap layer on the gate contact portion of the first conductive type MIS transistor and the cap layer on the gate contact portion of the second conductive type MIS transistor, and then, implanting a second conductive type impurity;
  an eighth step of forming an interlayer film, which is different from the insulating film, above the substrate; and
  a ninth step of forming contact holes by selectively etching the interlayer film, said contact holes extending to a source/drain of the first conductive type MIS transistor, a source/drain of the second conductive type MIS transistor and the gate contact portions.

11. The method of manufacturing a semiconductor device according to claim 10, wherein the part of the MIS transistor formation region is a memory cell portion.

12. The method of manufacturing a semiconductor device according to claim 10, wherein, in the step of forming the plug contact, a plug material is deposited between the adjacent gates, followed by etching-back, thereby burying the plug material between the adjacent gates.

13. The method of manufacturing a semiconductor device according to claim 12, wherein polysilicon is used as the plug material.

14. The method of manufacturing a semiconductor device according to claim 10, wherein the contact holes extending to the source/drain of the first conductive type MIS transistor and to the source/drain of the second conductive type MIS transistor are formed in a self-alignment manner as to the laminate structure processed into the gate form.

15. A method of manufacturing a semiconductor device, comprising:
  processing a plurality of gate laminate structures each having a gate insulating film, a gate electrode and a cap layer formed on a substrate, in order to form a first MIS transistor and a second MIS transistor;
  etching an entire surface of an insulating film which coats the first MIS transistor region remaining on the cap layer of the first MIS transistor and etching a part of the cap layer of the second MIS transistor to substantially expose a substrate surface of the first MIS transistor region and at the same time to remove the part of the cap layer from a gate contact portion of the second MIS transistor;
  forming an interlayer film which is different from the insulating film above the substrate; and
  forming contact holes by selecting etching the interlayer film, said contact holes extending to a source/drain of the first MIS transistor and the gate contact portion of the second MIS transistor.

16. A method according to claim 15, further comprising: between the processing and etching steps, forming a shallow diffusion layer having an LDD structure in at least one of the first and second MIS transistor by implanting impurity into the substrate.

17. A method according to claim 15, further comprising: between the processing and etching steps, forming a plug contact in a part of a space between adjacent gates.

18. A method according to claim 17, wherein the step of forming a plug contact comprises depositing a plug material between the adjacent gates, followed by etching-back, thereby burying the plug material between the adjacent gates.

19. A method according to claim 15, wherein the plug material is polysilicon.

20. A method according to claim 15, further comprising: between the etching step and the forming an interlayer film step, depositing a thin insulating film on the substrate.

21. A method according to claim 20, wherein the thin insulating film and an element isolation insulating film formed between the first and the second MIS transistors have the respective etching selective ratios.

22. A method according to claim 15, wherein the contact holes extending to the source/drain of the first MIS transistor are formed in a self-alignment manner as to the laminate structure processed into the gate form.

23. A method of manufacturing a semiconductor device comprising the steps of:

processing a laminate structure consisting of a gate insulating film, a gate electrode and a cap layer on a substrate in order to form a first MIS transistor and a second MIS transistor, and simultaneously forming a side wall on both sides of at least one of the first and second MIS transistors;

etching an entire surface of an insulating film which coats the first MIS transistor region and a cap layer on a gate contact portion of the second MIS transistor to substantially expose a substrate surface of the first MIS transistor and at the same time remove a part of the cap layer from the gate contact portion of the second MIS transistor;

forming an interlayer film which is different from the insulating film, above the substrate; and forming contact holes by selectively etching the interlayer film, said contact holes extending to a source/drain of the first MIS transistor and the gate contact portion of the second MIS transistor.

24. A method according to claim 23, further comprising: between the processing and etching steps, forming a shallow diffusion layer having an LDD structure in at least one of the first and second MIS transistors by implanting impurity into the substrate.

25. A method according to claim 23, further comprising: between the processing and etching steps, forming a plug contact in a part of a space between adjacent gates.

26. A method according to claim 25, wherein the step of forming a plug contact comprises depositing a plug material on the space between adjacent gates, followed by etching-back, thereby burying the plug material in the space between the gates.

27. A method according to claim 26, wherein the plug material is polysilicon.

28. A method according to claim 23, further comprising: between the etching step and the interlayer film forming step, depositing a thin insulating film on the substrate.

29. A method according to claim 28, wherein the thin insulating film and an element isolation insulating film formed between the first and the second MIS transistors have respective etching selective ratios.

30. A method according to claim 23, wherein the contact holes extending to the source/drain of the first and the second MIS transistors are formed in a self alignment manner as to the laminate structure.

* * * * *